(12) United States Patent
Bandy et al.

(10) Patent No.: US 7,060,626 B2
(45) Date of Patent: Jun. 13, 2006

(54) MULTI-RUN SELECTIVE PATTERN AND ETCH WAFER PROCESS

(75) Inventors: Kenneth A. Bandy, Red Hook, NY (US); Vincent J. Carlos, Essex Town, VT (US); Mark D. Levy, Essex Junction, VT (US); Sara L. Lucas, Burlington, VT (US); Timothy C. Milmore, South Burlington, VT (US); Matthew C. Nicholls, South Burlington, VT (US); Jason Nowakowski, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 10/604,087

(22) Filed: Jun. 25, 2003

(65) Prior Publication Data
US 2004/0266202 A1 Dec. 30, 2004

(51) Int. Cl.
*H01L 21/302* (2006.01)
(52) U.S. Cl. .................. 438/714; 438/706; 438/710; 430/312; 216/47
(58) Field of Classification Search ............ 438/706, 438/710, 712, 714, 717; 430/312, 313, 316, 430/31; 216/47
See application file for complete search history.

(56) References Cited

U.S. PATENT DOCUMENTS

| 4,155,627 | A | * | 5/1979 | Gale et al. ............... 359/568 |
| 5,629,772 | A | | 5/1997 | Ausschnitt ............... 256/372 |
| 5,790,254 | A | | 8/1998 | Ausschnitt ............... 356/372 |
| 5,980,766 | A | | 11/1999 | Flamm et al. ............. 216/59 |
| 5,994,175 | A | * | 11/1999 | Gardner et al. ........... 438/199 |
| 6,090,717 | A | * | 7/2000 | Powell et al. ............ 438/710 |
| 6,191,046 | B1 | * | 2/2001 | Singh et al. ............. 438/723 |
| 6,232,134 | B1 | | 5/2001 | Farber et al. ............. 438/9 |
| 6,245,581 | B1 | | 6/2001 | Bonser et al. ............. 438/8 |
| 6,716,763 | B1 | * | 4/2004 | Li et al. ................. 438/711 |
| 6,846,618 | B1 | * | 1/2005 | Hsu et al. ................ 430/316 |

* cited by examiner

*Primary Examiner*—Lan Vinh
(74) *Attorney, Agent, or Firm*—Scully, Scott, Murphy & Presser, P.C.; William D. Sabo, Esq.

(57) ABSTRACT

A method for forming a semiconductor wafer comprising of applying a first patterned resist to at least one first predetermined region of a wafer where said at least one first predetermined region of said wafer are protected by said first patterned resist and a first remaining portion of said wafer is not protected by said first patterned resist; etching said first remaining portion of said wafer not protected by said first pattern resist; stripping the first pattern resist from said wafer; applying a second patterned resist to at least one second pre-determined region of said wafer where said at least one second predetermined region of said wafer are protected by a second patterned resist and a second remaining portion is not protected by said second patterned resist; etching said second remaining portion not protected by said second patterned resist; and stripping said second patterned resist from said wafer.

20 Claims, 5 Drawing Sheets

MULTI-RUN SELECTIVE PATTERN AND ETCH WAFER PROCESS

BACKGROUND OF INVENTION

Field of Invention

This invention relates generally to semiconductor wafer manufacturing, and, more particularly, to a method for wafer processing where pre-selected areas of the wafer are treated independently from non-selected areas in a multi-run iterative process.

The manufacture of semiconductor wafers requires a number of process steps to create a packaged semiconductor device from raw semiconductor material. Patterning silicon wafers involves two coordinated steps, photolithography and etch. Photolithography prints the desired image into photoresist and etching transfers the initial image into the substrate. Metrology of the lithography and etch process steps are a necessary means for measuring the performance of fabrication processes to ensure that specific quality standards are attained. To accomplish this requires a wafer, a measurement tool and the means to analyze the data. Critical lithography and etch quality parameters for wafer production are overlay values; and the critical dimension of the features.

Lithography is a selective process and can be tailored to specific regions of the wafer. Conventionally etch, contrary to lithography, is not a selective process but a process that affects the entire surface of the wafer. Therefore, when conventionally processing two chip designs requiring different etch properties on a single wafer, obtaining the optimum etch process variables for one-chip design results in the other chip design being etched at less than optimum conditions.

Conventionally, in order to provide optimum process steps for producing semiconductor wafers, prior art systems often required patterned test wafers to be processed and then cross-sectioned to determine how the processing steps are currently being performed. Conventional wafer production incorporate etch process steps which affect an entire wafer surface, without selectivity to predetermined regions, and result in a high number of scrapped wafers during optimization of the process.

Additionally, conventional lithography and etch process steps utilized to process Si wafers have a number of limitations. Common limitations encountered during the optimization of wafer manufacturing involve etch regionality effects; line tailoring; and multipart number wafers, where a high number of scrapped wafers results in an increased consumption of wafer material and increased process cost.

Etch regionality effects is a phenomena whereby the features of the device etch more rapidly in one region of the wafer than the rest of the wafer resulting in a non-uniform etch distribution. For example, when the wafer etches most rapidly in the center of the wafer, either un-etched features on the outside of the wafer or over-etched features in the center of the wafer can result during etch process steps.

Line tailoring is where the gates of the device are tailored so that the critical dimension, the channel length, provides the optimum device speed. Tailoring the channel length of the device is achieved by photolithographic striping of the wafer using different image sizes. Each etch experiment conducted in order to optimize etch variables requires the use of a new wafer, since conventional etch process steps effect the entire surface of the wafer. Therefore, conventional line tailoring results in an increased consumption of wafer raw materials due to etch process steps.

Multi-part number wafers are where multiple designs are produced on a single wafer. Multi-part number wafers are being processed but currently there is no way to compensate for the different etch requirements for different wafer designs, which is a limitation to designers.

Due to the above limitations a large number of wafers are routinely scrapped during etch experimentation and optimization. Etch experiments require many wafers in order to account for the number of variables in the etch process. The increased consumption of raw materials during process optimization is further amplified by increasing wafer size.

What is needed is a multi-run wafer production method having a regional selective etch treatment that overcomes the limitations of the current process steps.

SUMMARY OF INVENTION

The present invention provides a method of multi-run wafer production where predetermined regions of a semiconductor wafer are selectively etched throughout wafer production. One aspect of the present invention in broad terms is a method for processing a semiconductor wafer comprising the steps of:

a) etching one or more first regions of a wafer according to a first set of etch variables, where a remaining portion of said wafer is prevented from being etched; and b) etching one or more other regions of said remaining portion of said wafer according to another set of etch variables, wherein one or more previously etched first regions and any remaining portion of said wafer is prevented from being etched.

Another aspect of the present invention is a method for processing a semiconductor wafer comprising the steps of:

a) doping at least one first region of a wafer with a first set of doping variables, where a remaining portion of said wafer is prevented from being doped; and b) doping one or more other regions of said remaining portion of said wafer according to another set of doping variables, wherein one or more previously doped first regions and any remaining portion of said wafer is prevented from being doped.

Step b) of the above methods may be performed N times, where N is a whole number equal to or greater than one.

Specifically, a wafer is provided and patterned using photolithographic process steps. Photolithography is the process, which sets the surface dimensions on the various parts of the wafer. Patterning is a basic operation that removes specific regions of the top layers on the wafer surface. The processed regions are pre-selected areas that may be determined by customer specifications. The pre-selected areas can be defined by performance results, as defined by the manufacturer or customer, or by modeling.

In the present invention a layer of photoresist is patterned to protected pre-selected areas of the wafer, where the exposed areas of the wafer not protected by the photoresist are etched according to customer specifications. Conventionally, the etch or implant processes affect the entire surface of the device. The present invention, by applying a patterned photoresist to pre-selected areas of the wafer prior to etch process steps, protects those areas during the first etch process. Once the resists are removed etching of another pre-selected area during a second etch may be performed. This process allows for multiple etch process steps with different etch variables to be applied to one wafer.

First, a photo resist layer is provided where the photo resist layer is selectively exposed resulting in a combination of patterned and unpatterned portions of photoresist on the wafer surface. Patterning comprises transferring an image to a light sensitive layer of photoresist where the image is produced by a reticle having an opaque region. In one aspect of the present invention the light image determines a first region and at least one other region of the wafer. When the wafer is etched only the portions of the wafer exposed to the light image are affected. Ideally, a pattern is provided on the surface where the pattern dimensions are as close to the design requirements as possible. The pattern dimensions are referred to as the image sizes of the circuit.

Following the photolithography process steps the exposed fields can then be subject to an etch process. Etch chemistries selective to the photoresist remove the portion of the wafer not covered by the photoresist. It is in the etch process step where the image created in the photolithography process step is permanently transferred into the surface layer of the wafer. After etching, the pattern is a permanently transferred into the top layer of the wafer, preferably an oxide layer. The resist layer that has acted as an etch barrier is no longer needed and is removed from the surface. The resist layer can be stripped using a wet chemical process.

A second pattern is then applied to the surface of the wafer. The second pattern is positioned to etch the regions of the wafer that were protected by the photoresist during the first etch process steps. Following the application of the second pattern, the wafer is etched and the resists is removed. This process can be repeated numerous times until the desired conditions are attained. Using the above described process the number of etch experiments may be reduced in order to produce optimum processing conditions, therefore reducing raw material consumption.

Alternatively, predetermined regions of a semiconductor wafer may be selectively doped by using the above-described method and substituting implant process steps for etch process steps. Another aspect of the present invention is to incorporate both implant process steps and etch process steps.

DETAILED DESCRIPTION

Figure 1:
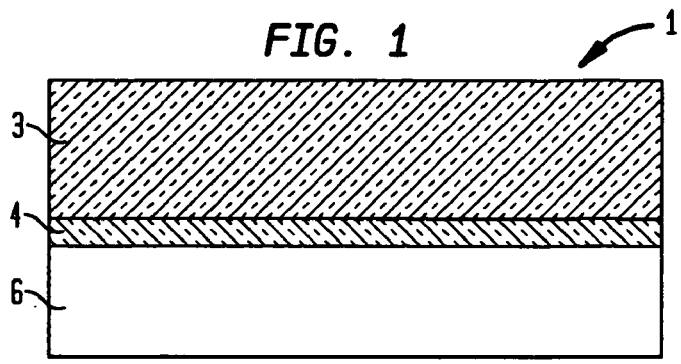
FIG. 1 is a pictorial representation (through cross sectional view) showing the initial semiconductor wafer structure.

The present invention, which provides a multi-run wafer production method having a selective region etch treatment or implant, will now be discussed in greater detail by referring to the drawings that accompany the present application. It is noted that in the accompanying drawings like reference numerals are used for describing like and corresponding elements.

Referring to FIG. 1, a wafer 1 is provided preferably including a layered stack atop a substrate 6. The layered stack comprises of at least one material layer, preferably being an oxide layer 3 such as $SiO_2$, atop a thin layer of nitride 4, such as $Si_3N_4$ or other like materials including but not limited to SiN. The material layer may comprise alumina, polysilicon (poly-Si), silicon, copper, TiN, TaN, oxide, nitride, polyimide or combinations thereof, preferably being oxide material. ubstrate materials include but are not limited to: any semiconducting material such as Si, SiGe, GaAs, InAs and other like semiconductors. Additionally, the substrate could further include a conducting layer or metal layer comprising Cu, or Al positioned at the top surface of the substrate. The thin nitride layer 4 prevents electromigration and acts as an etch stop layer. TAlthough te nitride layer 4 aacts as an etch stop in order to protect the underlying substrate from etch and corrosion during etch process steps selective to removing oxides, it is not a required layer in all of the various layered stacks embodied in the present invention Referring to FIG. 2, an initial photolithography process is performed atop wafer 1, as depicted in block 10. In general, the initial photolithography process steps define the pre-selected protected regions of the wafer that are not etched and which regions of the wafer are to be exposed and therefore etched during the first etch process run. Alternatively, the initial photolithography process steps define the pre-selected protected regions of the wafer that are not to be doped or implanted and which regions of the wafer are to be exposed and therefore doped using implant process steps. The regions of the wafer are defined by the opaque image pattern of the reticle and through the use of blinders. The photolithography steps are now described in more detail.

A thin layer of photoresist material is applied atop the wafer via spin coating or similar processes. The photoresist material comprises of dielectrics including carbon, oxygen, and various inorganic materials. Following application of the photoresist layer, the photoresist is soft-baked, where the solvents of the photoresist layer are evaporated via heating.

Figure 2:
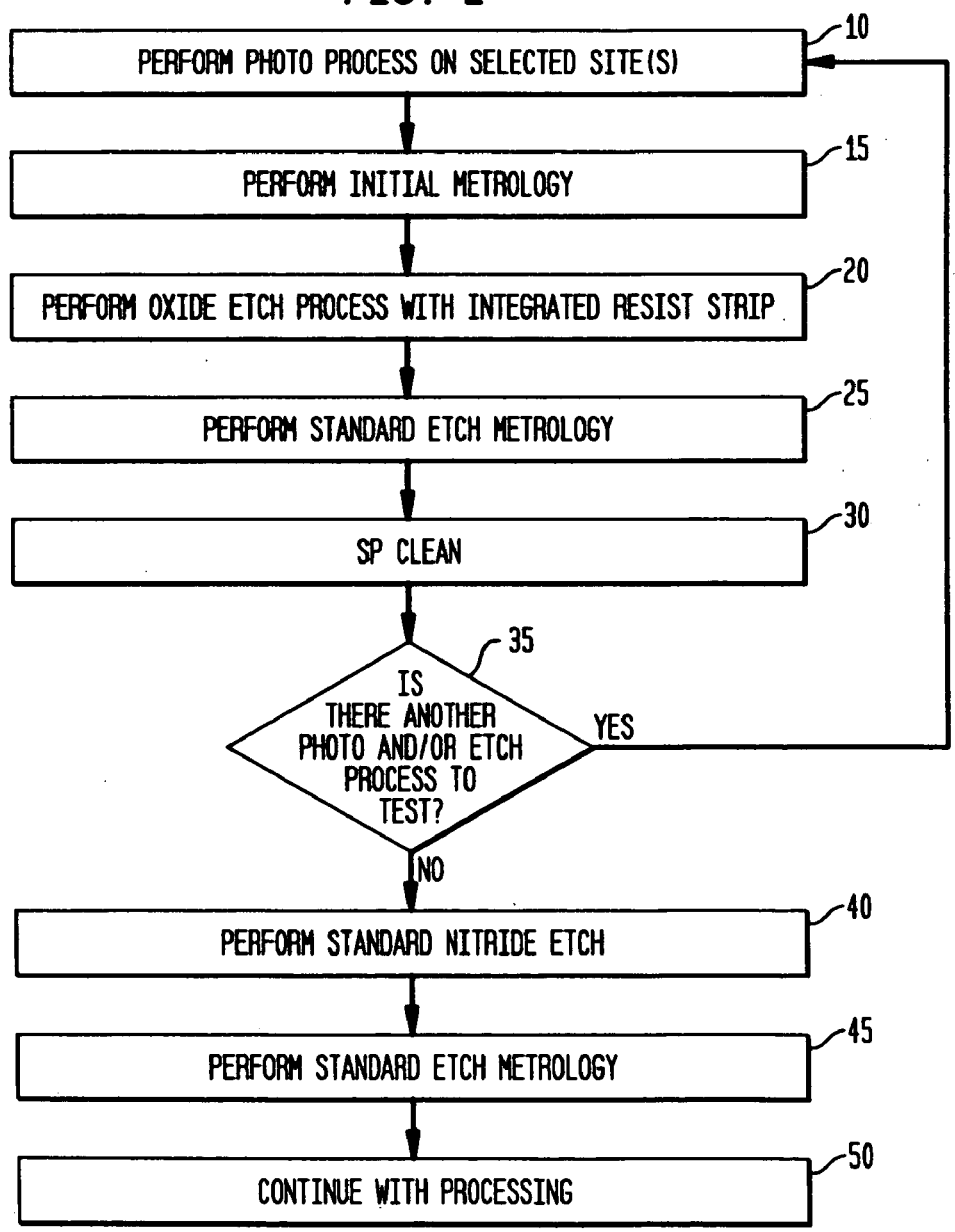
FIG. 2 illustrates a flow diagram of a multi-run selective pattern and etch wafer process.
Figure 3:
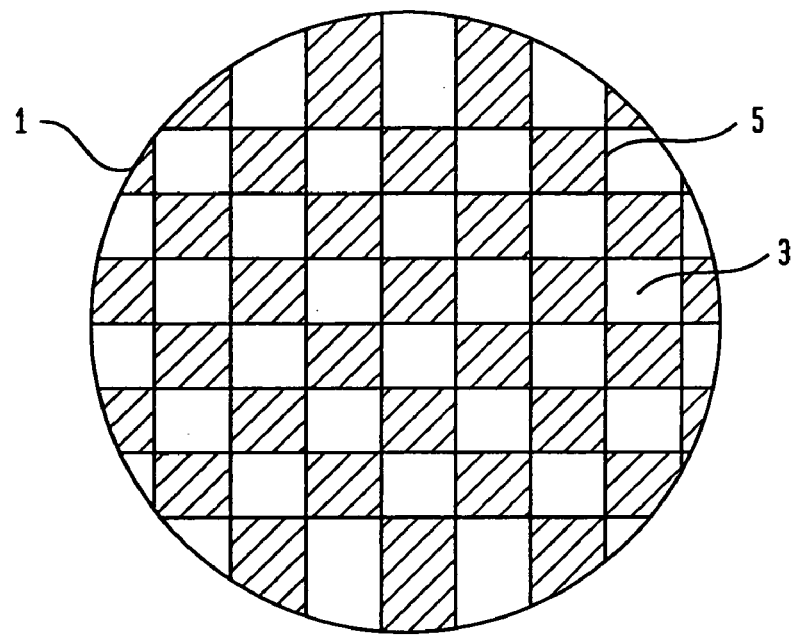
FIG. 3 is a pictorial representation (top view) of a wafer having both patterned regions and exposed portions.

The layer of photoresist is then patterned using a photolithography process as depicted in block 10 of FIG. 2. A patterned photoresist is formed utilizing conventional photolithography and etch process steps. Specifically, a pattern is formed using a reticle or photomask and transferred into the surface of the wafer. First, the pattern on the reticle or photomask is transferred onto a layer of photoresist on the surface to be etched, or alternatively implanted. Light is passed through the opaque pattern of the reticle, which in turn produces a patterned image on the layer of photoresist. The photoresist layer is a light or radiation sensitive material and exposure to light causes changes in the photoresist structure. For example, exposure to light may change the exposed portions of the photoresist from a soluble condition to an insoluble one. In addition to the patterns produced by the reticle, regions of the wafer may be selectively patterned by adjusting the step plan of the photolithography tool to avoid exposing specified areas. The step plan adjustment is a determination of which fields to expose. Normally the lithography tool prints every field in a tight matrix or checkerboard pattern to maximize the number of chips on a wafer. An aspect of the present invention is to manipulate the step plan in order to selectively expose each desired field. The opaque reticle pattern and reticle blinders may be used together or separately. FIG. 3 depicts an example of a wafer 1 having both patterned regions 5 and exposed portions 3.

Following exposure the pattern is developed utilizing conventional developer, such as a chemical solvent. The developer leaves a hole in the resist layer that corresponds to the opaque pattern of the reticle. An alternative resist strategy, commonly referred to as a negative resist, leaves a pattern in the resist opposite to that on the mask. Development of the pattern is conducted using conventional development techniques including, but not limited to: continuous spray development and puddle development.

Referring back to FIG. 2, once the initial photolithography process is completed, a metrology-data acquisition procedure is performed on the processed semiconductor wafer using conventional measurement/analysis tools, as depicted in block 15. Metrology is the science of measurement to determine dimensions, quality, and capacity. Metrology during fabrication employs measurement equipment and sensors to collect and analyze data about wafer parameters and defects.

Alignment or correct placement of the circuit pattern is critical issue in the photolithographic process step. The entire circuit pattern must be correctly placed on the wafer surface and the individual parts of the circuit must be relative to each other. During photolithography in addition to dimension control and pattern alignment, defect control is also critical.

Some of the metrology tools utilized include, but are not limited to: SEM, overlay, and defect inspections. The metrology data is then analyzed and if a pattern is out of specification or exceeds dimension tolerance limits a rework step as known in the art, may be conducted.

Once the patterning of the photoresist is completed, the regions of the oxide layer of the wafer covered by the photoresist are protected while the exposed regions are removed using a selective etching process that removes the unprotected regions. The sections covered by the resist are protected because the chemistry of the resist is such that the resist does not dissolve under etch process steps.

A The material layer is then etched. When etching a material layer comprising the preferred oxide material, a oxide etch process is performed on the wafer with an integrated resist strip, as depicted in block 20 of FIG. 2. This etch process will include an ARC (anti-reflection coating) breakthrough step, a dielectric etch step, and a resist strip step. The process chemistries may include, but are not limited to: $CF_4O2_2CHF_3_3CH_3_3$, $C_4_48_8CO$, or Ar. Etching of the substrate is performed using a conventional timed etch process step that is highly selective in removing oxide as opposed to nitrides and forms a trench structure into the wafer surface. Conventional dry etching processes that may be employed include, but are not limited to: Reactive Ion Etch (RIE), ion-beam etching, plasma etching, etc. Etch compositions that may be utilized for etching the oxide layer include HF, $CF_4O2_2CHF_3_3CH_3_3$, $C_4_{48}$, CO, or AArgon. Alternatively, material layers comprising alumina, polysilicon (poly-Si), silicon, copper, TiN, TaN, nitride, and polyimide may be etched Alternatively, instead of etching the exposed regions in block 20, the exposed surfaces may be doped using convention implant process steps. Dopants are selected depending on the performance required of the device. For example, P-type device dopants for Si are Group III-A elements, such as boron, while the N-type device dopants are Group V elements, such as phosphorus. Doping variables include dopant species, dopant concentration, and implant energy.

An integrated resist strip step may be incorporated with the material layer etch or implant process step. A number of different chemicals maybe used for stripping and are dependent on the wafer surface, production considerations, the polarity of the resist, and the condition of the resist. Preferably, solutions of sulfuric acid and an oxidant, such as hydrogen peroxide or ammonium persulfate, or plasmas containing $CF_4N2_2_2$ and $O_2$ are used for stripping the dielectric photoresist.

Once the material layer etch process is finished, a standard etch metrology is performed as depicted in block 25 of FIG. 2. A determination is made whether the pre-selected areas of the wafer are within the predetermined engineering specifications. The properties of the pre-selected areas, which are based on the material layer etch process metrology data of the semiconductor wafer being processed, are compared to a set of predetermined optimum properties. The set of predetermined minimum properties and predetermined maximum properties are generally customized for the particular type of semiconductor devices being manufactured. There is an etch component to the final measurements, called an etch bias. Etch bias is the difference between the critical dimension of the patterned photoresist layer and the etched region of the device. Etch bias influences the etched image size.

Etch metrology may be conducted by manual microscope inspection and automatic inspection tools similar to the inspection tools used in aforementioned photolithography inspection. The etch metrology process step 25 is very similar to initial metrology, except that there is no photoresist and defective wafers cannot be reworked. One measurement that occurs during etch metrology is the automated measurement to verify critical dimension on a particular mask level. Generally, the quality of the etch process is verified by inspection for etch problems such as over-etching, under-etching, and undercutting.

Alternatively, the above described etch metrology step may be configured for evaluating doped regions formed during implant process steps. Defectively implanted wafers, similar to defectively etched wafers, may not be reworked.

Following etch metrology 25 an SP (Sulfuric Peroxide) clean step 30 is performed where any remaining polymer residue is removed from the wafer by a chemical cleaner. The cleaner may comprise of a 30% HF solution or sulfuric acid composition however other compositions may be used.

The first photolithography and etch process or implant run concludes with a run analysis process step 35 that determines whether another photolithography and etch process or implant run is to be performed. The etch variables of a second etch process may be different from the first etch process. Etch variables that may be changed in the subsequent iterations may include, but are not limited to: etch time, etch chemistry, etch concentration, tool chuck temperature, tool wall temperature, plasma power, or gas ratios or flows. The decision to run a second photolithography and etch process or implant run may be part of the original process flow. The etch variables of a second etch process may be different from the first etch process. Etch variables that may be changed in the subsequent iterations may include, but are not limited to: etch time, etch chemistry, etch concentration, tool chuck temperature, tool wall temperature, plasma power, or gas ratios or flows. The doping variables of a second implant process may be different from the first implant process. Doping variables include dopant species, dopant concentration, and implant energy. The decision to run a second photolithography and etch process or implant run may be part of the original process flow.

If there are more regions/chips on the wafers surface that need to be processed or if a determination is made that the properties of the selected areas are insufficient, the above-described process steps may be repeated for each region/chip. More specifically, if a second run is conducted the following process steps are repeated on the same wafer in the order as presented: photolithographic process steps 10, initial metrology 15, oxide etch 20, etch metrology 25, SP clean 30, and process analysis 35. Alternatively, implant process steps may be substituted for oxide etch 20 process steps. Iteration of these process steps may be repeated numerous times for different pre-selected areas until the desired conditions are attained. With each iteration the etch process variables or implant variables may be changed.

Once a determination is made at step 35, that the selected areas are sufficiently processed during patterning and oxide etch, a standard nitride etch process step is conducted, as illustrated in block 40 of FIG. 2. The standard nitride etch 40 is a blanket process where the etch process is selective to removing the nitride layer without attacking the underlying substrate. Conventional dry etching processes that may be employed include, but are not limited to: Reactive Ion Etch (RIE) and plasma etching. When the nitride layer comprises silicon nitride, etch concentrations may include, but are not limited to: $CF_4$, $O_2$, $N_2$, or Argon may be utilized as an etch composition. Following nitride etch step 40, an etch metrology process step 45 is conducted that is similar to the etch metrology process step 25. At this point the wafer has been etched sufficiently to allow communication between the wafer and interconnect wiring atop the wafer during metallization formed during later conventional processing steps 50.

In one embodiment of the present invention the lithography and etch process steps are tailored to overcome the limitations of etch regionality effects. Etch regionality effects are where the features of the pattern etch more rapidly in one region of the wafer than in the rest of the wafer. Etch regionality effects result in insufficiently etched areas where the etch process is slow or over-etched regions where the etch process is most rapid. In one example, the center of the wafer etches most rapidly resulting in un-etched features on the outside of the wafer or over-etched features in the center of the wafer.

Figure 4:
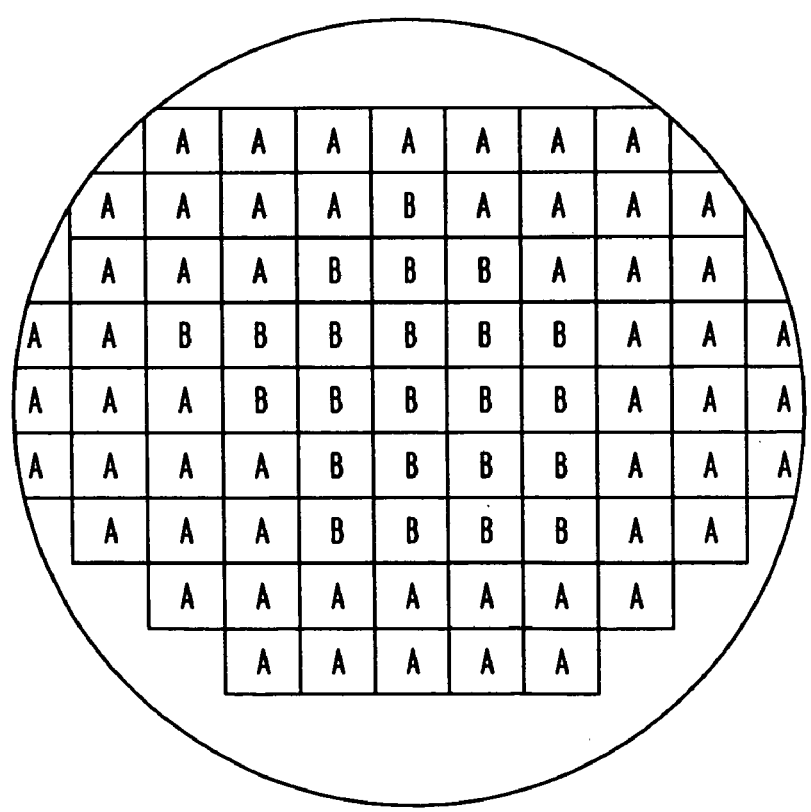
FIG. 4 is a pictorial representation (top view) of a wafer exhibiting regionality effects.

According to the present invention, etch regionality effects are overcome by running multiple photolithography and etch process runs on a single wafer. Referring to FIG. 4, depicting a wafer surface having etch regions A and B, if one area of the region A etches at a faster rate than the rest of the wafer, the fast etching region A is selectively exposed while the remaining portion B of the wafer is protected by blanket resist. Following photolithography, the features of the exposed portion A are etched while the regions covered by the resist B are protected. After the etch is complete the resist is removed and the surface of the wafer is cleaned. Thereafter, the wafer is treated to a second lithography process step where the fast etching region A of the wafer is protected by a second resist while the slower etching portion B of the wafer, that was protected during the first etch process, is exposed. A second etch process is then conducted where the features of exposed slower etching region B of the wafer are etched while the features of the faster etching region A are protected by the overlying second resist. The second pattern is then stripped and the wafer is cleaned.

Using this multi-run method the etch variables for optimum etching can be tailored to both fast A and slow B regions of the wafer, therefore overcoming etch regionality effects. Therefore, using the present invention at least one pre-selected region of the wafer can be etched using one etch variable while a secondary region of the wafer can be etched using a second etch variable. Alternatively, the same operating scenario utilized to overcome etch regionality can be employed with implant process steps in order to more accurately control dopant concentration throughout the wafer during implant process steps.

According to a further aspect of the invention, the photolithography and etch process steps may be tailored to process one particular field or area having a higher pattern density or different line size than the rest of the pattern. The area of the wafer having a higher pattern density will react differently to etch and lithography process steps than the rest of a wafer. To overcome these differences, photolithography process steps could be implemented to pattern and expose the entire field without exposing the particular portion of the wafer having a higher etch density or different line width. Then, a second series of photolithography and etch process steps may be performed where the region of higher etch density or different line width is exposed and etched while the remaining portion of the wafer is protected by photoresist. Using this method both the region of higher pattern density and the remaining portion of lower pattern density can be optimized.

Figure 5:
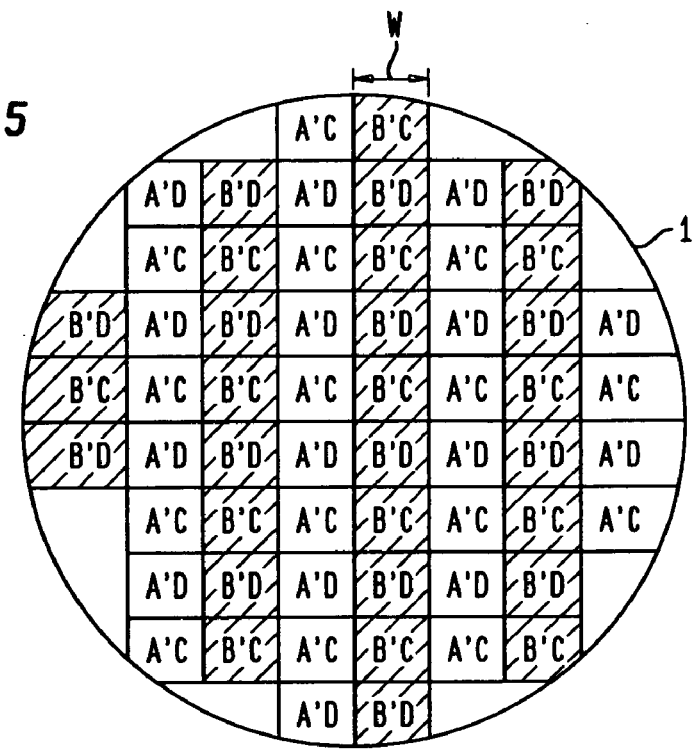
FIG. 5 is a pictorial representation (top view) of a wafer exhibiting line-striping effects.

In another embodiment of the present invention, the photolithography and etch process steps are configured to overcome the limitations of line tailoring. Line tailoring is the dimensioning of the gates of a device, such as a FET, so that a critical dimension, the channel length, is tailored for the optimum device speed. Conventionally, tailoring the channel length of the device is achieved by patterning the wafer to form photoresist striping and utilizing multiple photolithography process steps of different image sizes. Each stripe of photoresist formed on the wafer is of a different width, preferably increasingly smaller. For example, a first photoresist strip of a first width is formed atop a wafer during a first photolithographic pass followed by the formation of a secondary photoresist strip of photoresist having a second width during a second photolithography pass. FIG. 5 depicts line striping across the surface of a wafer where line stripes are depicted as shaded vertical columns and vertical columns having a blank fill, where each line stripe has a line width W.

Etch chemistry is also an important component of line tailoring. Conventional etch processes affect the entire surface of the wafer without selectivity of specific regions. Using conventional processing, each time the etch variables are changed a new wafer must be etched in order to optimize the etch process. Therefore, conventional etch process steps limit line tailoring experimentation of a wafer to one pass through the etch process step for each etch composition.

One aspect of the present invention allows for both photolithographic line tailoring and etch line tailoring where a wafer may be optimized using a reduced number of wafers by subjecting a single wafer to multiple photolithographic process steps and multiple etch process steps each selective to a specific region of the wafer. In the present invention line tailoring can be accomplished solely using photolithography, solely using multiple etch process steps, and a combination of both etch process steps and photolithography, as described with respect to FIG. 2, steps 10 and 20.

In order to optimize line tailoring while overcoming the disadvantages associated with conventional line tailoring, the present invention includes photoresist striping of the wafers using conventional lithography. Next, an etch matrix is produced which is comprised of multiple process passes that have different etch process conditions which are designed to change the effective etch bias (e.g. the amount of change in critical dimension from the post-lithography measurement to the post-etch measurement). This allows for etch process steps to be selectively applied to specific regions of the wafer. By providing a method to expose different regions of a single wafer to multiple etch process steps, incorporating different etch variables and etch chemistries, optimization is achieved more quickly, while reducing the number of scrapped wafers.

FIG. 5 depicts an example of a line tailoring pattern formed using a multi-run wafer process, comprising two photolithography process steps and two etch process steps, where the regions of the wafer treated during the photolithography process steps (of FIG. 2) are depicted using reference letters A' and B' and the regions of the wafer treated during etch process steps are depicted by reference letters C and D. In lithography, different critical dimension sizes can be created by different focus conditions or other such variables including, but not limited to: focus, resist type, or tool type. Etch may vary conditions including etch times, temperatures, voltages, or chemistries to obtain the optimal process. The regions treated during the etch process steps C, D depict an etch matrix. The etch matrix is defined during photolithography process steps, where the regions are selectively etched using reticle patterning or applying photoresist atop photolithographic areas using patterning and further defining exposed regions with reticle blinders.

Figure 6:
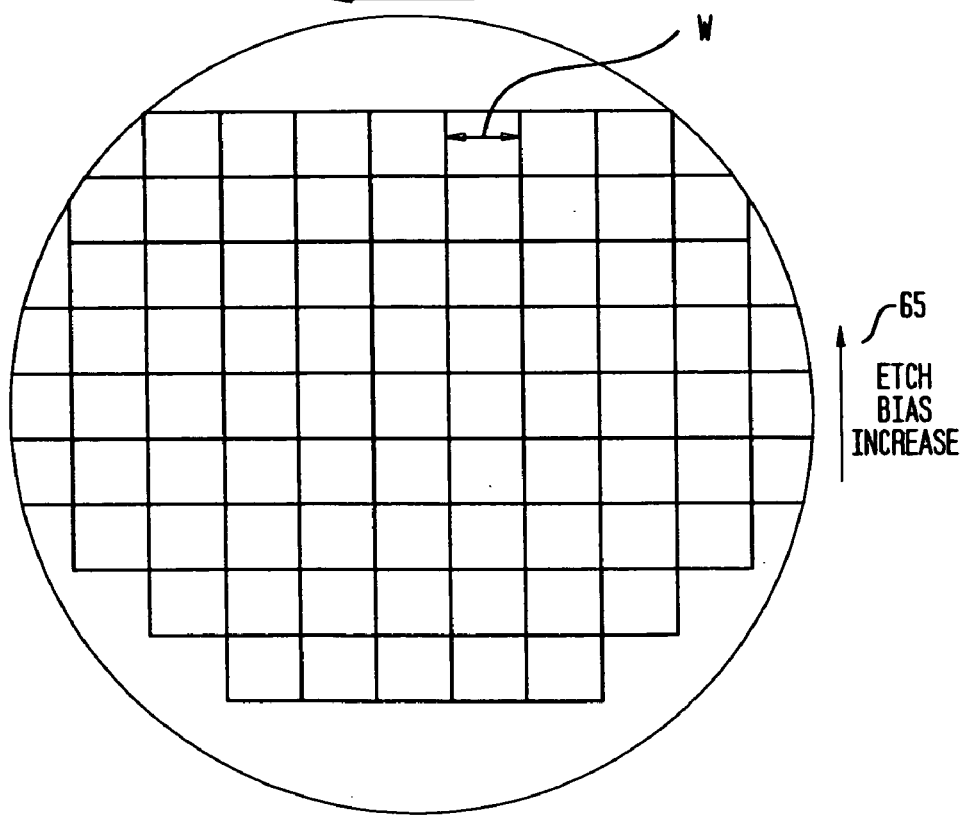
FIG. 6 is a pictorial representation (top view) of a wafer where the photolithography dosage and etch bias is increased across the wafer surface.

Another aspect of the inventive method for line tailoring allows for a series of etch line striping steps where following photo resist line striping formed using photolithography, a matrix of increasing etch bias is utilized to further decrease the photoresist line width W and further decrease resultant device gate size. The concentration of photolithography dose and etch bias is pictorially represented in FIG. 6, where the arrows indicate increasing photolithography exposure 60 or etch increasing bias 65 respectively. Assuming positive resist, gate size decreases with increasing dose and positive etch bias. Therefore, varying the etch bias and exposure will determine a process window and optimum value for both processes. Typically, line width W decreases with increasing exposure across the wafer 1 in FIG. 6. Additionally, implant process steps may be utilized to increase the dopant concentration. By increasing the concentration of dopants the device switching speed is increased. Using the above described process the exposed portion of the wafer is doped by substituting conventional implant process steps for etch process steps.

Figure 7:
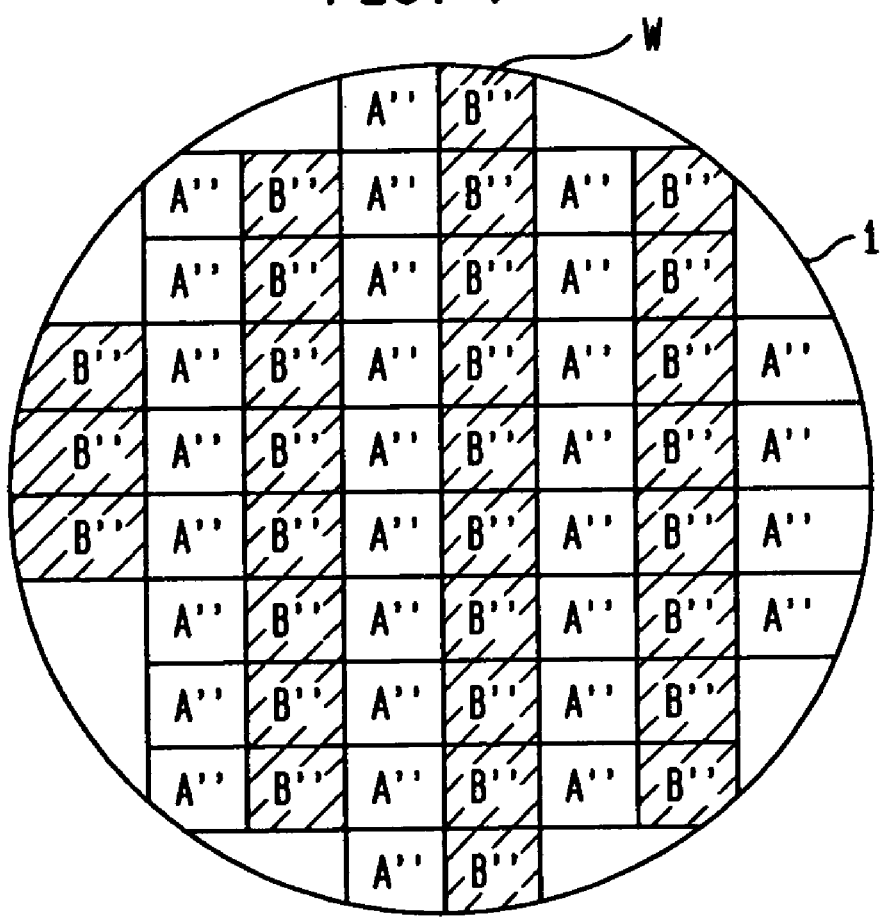
FIG. 7 is a pictorial representation (top view) of a wafer exhibiting multi-part number effects.

A further embodiment of the present invention provides photolithography and etch process steps configured to overcome the limitations of conventional processing of multipart numbered wafers. Referring to FIG. 7, multi-part number wafers are conventionally produced using one photoresist mask to pattern two or three different regions for producing different designs within the wafer, such as design 1 on region A" and design 2 on region B". Pattern densities utilized on wafer designs may vary up to 300% due to etch loading, nested/iso offsets and the like. Conventional wafer production process methods can not compensate for such differences; rather, conventional process steps optimize the conditions for one design, such as design 1 on region A", while sacrificing conditions for the other, design 2 on region B". Conventionally, both region A" and region B" get the same processing since both region A" and region B" are treated using the same photolithography step and the same etch step. Therefore using the conventional process flow, one can not tailor the etch process steps to the requirements of the regions A" and B" separately.

Using the inventive method, section A" may be processed through photolithography, etch and optional rework process steps and then region B" may be processed using a second photolithography and etch process. During the processing of region B" both the photolithography process as well as the etch process steps may be varied from the etch and photolithography process steps utilized to process region A". The photolithography process steps may be varied by changing the numerical aperture, the photomask image, resist type, exposure, focus, tool type. The etch process steps may be modified by varying the geography of flow, temperature, and etch chemistries. Although the above example illustrates only two chip designs, multiple chip designs are also contemplated and included therein. Alternatively the above described resist pattern can be utilized during implant process steps so that a number of different dopant species can be introduced to specific pre-selected regions of a single wafer.

Figure 8:
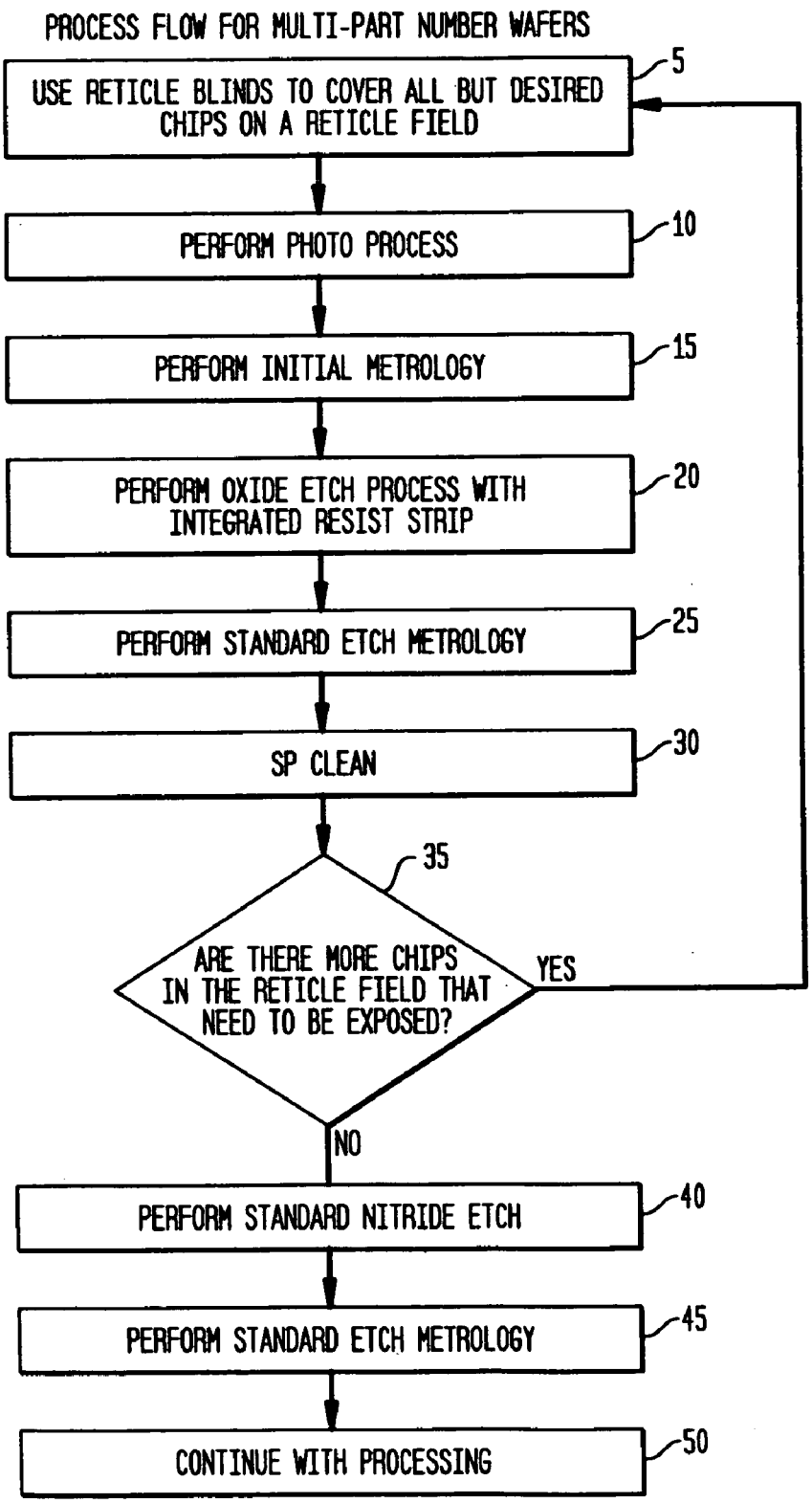
FIG. 8 illustrates a flow diagram of a multi-part number multi-run selective pattern and etch wafer process.

In addition to photo masking sections A" and B" reticle blinders may also be utilized to expose specific regions of the wafer without exposing the entire wafer. This process step is depicted in new block 5 of the flow diagram illustrated in FIG. 8, which otherwise is identical to the process depicted in FIG. 2.

The inventive method for wafer production also allows for etching of pre-selected specific areas of the wafer in order to compensate for a higher or lower occurrence of nested or isolated wire, or greatly varying RX pattern densities without etching the remaining portions of the wafer. As wafer sizes increase and more part numbers are linked, it will become more and more difficult to group parts with similar pattern densities and designs, making this aspect of the present invention an important option for improving yield and manufacturability.

By using the above method the problems of etch-regionality, over-etching, and under-etching are overcome and a more uniformly etched wafer is provided. Additionally, the etch process variables may vary during each etch iteration to further optimize the process.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method for processing a semiconductor wafer comprising the steps of:
    a) etching one or more first regions of a wafer according to a first set of etch variables, where a remaining portion of said wafer is prevented from being etched; and
    b) etching one or more other regions of said remaining portion of said wafer according to another set of etch variables, wherein one or more previously etched first regions and any remaining portion of said wafer is prevented from being etched.

2. The method of claim 1 wherein step b) is performed N times for etching N regions of said any remaining portion of said wafer, where N is a whole number equal to or greater than 1.

3. The method of claim 1 where said first set of etch variables and said another set of etch variables include etch chemistry, etch time, tool chuck temperature, tool wall temperature, plasma power, etch concentration, etch bias, and gas ratio.

4. The method of claim 2 where step a) further comprises:
depositing a first layer of photoresist atop said wafer;
patterning said first layer of photoresist to expose said one or more first regions of said wafer, where said remaining portion of said wafer is protected by a first patterned photoresist;
etching said wafer where one or more exposed portions of said wafer is etched while a first patterned photoresist protects said remaining portion of said wafer from etch; and
stripping said first patterned photoresist.

5. The method of claim 2 where step b) further comprises
depositing a secondary layer of photoresist atop said wafer;
patterning said secondary layer of photoresist where said one or more other regions of said wafer is exposed and where said one or more previously etched regions and said any remaining portion of said wafer are protected by a second patterned resist;
etching said wafer where said one or more other regions of said wafer is etched while said second patterned resist protects said one or more previously etched regions and said any remaining portion of said wafer from being further etched; and
stripping said second patterned photoresist.

6. The method of claim 4 where step b) further comprises
depositing a secondary layer photoresist atop said wafer;
patterning said secondary layer of photoresist where said one or more other regions of said wafer is exposed and where said one or more previously etched regions and said any remaining portion of said wafer are protected by a second patterned resist;
etching said wafer where said one or more other regions of said wafer is etched while said second patterned resist protects said one or more previously etched regions and said any remaining portion of said wafer from being further etched; and
stripping said second patterned photoresist.

7. The method of claim 6 where step a) further comprises:
measuring one or more first etched regions; and
comparing said one or more first etched regions to a predetermined specification.

8. The method of claim 6 where step b) further comprises:
measuring one or more other etched regions; and
comparing said one or more other etched regions to another predetermined specification.

9. The method of claim 6 where said patterning further comprises transferring an image to a light sensitive layer of photoresist where said image is produced by a recticle having an opaque region, where said light image determines said one or more first regions and said one or more other regions.

10. The method of claim 6 where said patterning further includes utilizing one or more reticle blinders to direct light to said one or more first regions and said one or more other regions.

11. The method of claim 6 where said one or more first regions of said wafer are processed for a first chip design and where said one or more other regions of said wafer are processed for a second chip design.

12. The method of claim 6 where said first photoresist pattern and said second photoresist pattern form an etch matrix.

13. The method of claim 6 where said first photoresist pattern is a first line stripe of photoresist across said wafer having a first line stripe width.

14. The method of claim 13 where said line stripe of photoresist is etched to decrease said first line stripe width.

15. The method of claim 14 where said second photoresist pattern is one or more other line stripes of photoresist across said wafer having one or more other line strip widths, where said one or more other line stripe widths are narrower than said first line stripe width of photoresist.

16. The method of claim 15 where said one or more other line stripes of photoresist is etched to decrease one or more other line stripe widths.

17. The method of claim 6 where said wafer comprises at least one material layer atop a substrate, where said at least one material layer includes alumina, poly-Si, silicon, copper, TiN, TaN, oxide, nitride, polyimide or combinations thereof.

18. The method of claim 6 further comprising reworking said first layer of photoresist prior to depositing a secondary layer of photoresist.

19. A method for processing a semiconductor wafer comprising the steps of
depositing a first layer of photoresist atop a wafer;
patterning said first layer of photoresist to expose one or more first regions of said wafer, where remaining portions of said wafer are protected by a first patterned photoresist;
doping said wafer in said exposed one or more first regions, while said first patterned photoresist protects said remaining portion of said wafer from being doped;
stripping said first patterned photoresist;
depositing a secondary layer photoresist atop said wafer;
patterning said secondary layer of photoresist where said one or more other regions of said wafer is exposed and where said one or more previously doped regions and said any remaining portions of said wafer are protected by a second patterned resist;
doping said wafer where said one or more other regions of said wafer is doped while said second patterned resist protects said one or more previously doped regions and said any remaining portions of said wafer from being further doped; and
stripping said second patterned photoresist.

20. The method of claim 19, where said first set of doping variables and said another set of doping variables comprise dopant species, dopant concentration, and implant energy.

* * * * *